United States Patent
Eckardt

(10) Patent No.: US 8,421,133 B2
(45) Date of Patent: Apr. 16, 2013

(54) DETECTOR MODULE

(75) Inventor: Andreas Eckardt, Berlin (DE)

(73) Assignee: Deutsches Zentrum fuer Luft- und Raumfahrt E.V., Cologne (DE)

(*) Notice: Subject to any disclaimer, the term of this patent is extended or adjusted under 35 U.S.C. 154(b) by 22 days.

(21) Appl. No.: 13/149,201

(22) Filed: May 31, 2011

(65) Prior Publication Data

US 2011/0291165 A1 Dec. 1, 2011

(30) Foreign Application Priority Data

May 28, 2010 (DE) .......................... 10 2010 021 819

(51) Int. Cl.
*H01L 27/146* (2006.01)
*H04N 5/225* (2006.01)

(52) U.S. Cl.
USPC ........... 257/290; 257/291; 257/294; 257/431; 257/E27.132; 257/E31.085; 257/E31.127

(58) Field of Classification Search .................. 257/290, 257/291, 294, 431, E27.132, E31.085, E31.127; 348/340; 378/39, 40
See application file for complete search history.

(56) References Cited

U.S. PATENT DOCUMENTS

| 2004/0263671 | A1* | 12/2004 | Takagi et al. ................. 348/340 |
| 2008/0063139 | A1* | 3/2008 | Pantsar et al. .................... 378/40 |
| 2010/0116999 | A1* | 5/2010 | Tumer et al. ............. 250/370.13 |

FOREIGN PATENT DOCUMENTS

| DE | 102008024417 B3 | 8/2009 |
| JP | 2004006564 A | 1/2004 |

OTHER PUBLICATIONS

Hamamatsu Photonics K.K.: "TDI Camera C10000-301, -401", Japan, 2008.

* cited by examiner

*Primary Examiner* — Dao H Nguyen
(74) *Attorney, Agent, or Firm* — Laurence A. Greenberg; Werner H. Stemer; Ralph E. Locher

(57) ABSTRACT

A detector module, in particular for super-resolution satellites, contains a multi-chip carrier. At least one TDI-CCD detector and at least one CMOS chip are arranged on the multi-chip carrier, and are electrically connected to one another. The CMOS chip contains at least the digital output electronics for the TDI-CCD detector.

11 Claims, 1 Drawing Sheet

DETECTOR MODULE

CROSS-REFERENCE TO RELATED APPLICATION

This application claims the priority, under 35 U.S.C. §119, of German application DE 10 2010 021 819.7-33, filed May 28, 2010; the prior application is herewith incorporated by reference in its entirety.

BACKGROUND OF THE INVENTION

Field of the Invention

The invention relates to a detector module, in particular for super-resolution satellites.

Detectors and sensors are currently known, which scan the earth from orbit with the aid of lines and/or matrixes. With the aid of detectors and sensors of this type it is possible to scan the earth in various spectral or panchromatic wavelengths. These detectors can operate in a normal recording mode as well as in time delay integration (TDI) mode. In a TDI mode, a TDI step scene is recorded multiple times corresponding to the number of steps, wherein the charged packets of the individual steps are displaced synchronously with the movement to the next line. It holds true here that with constant assumed speed of the satellite, the line rate has to be increased in order to increase the geometric resolution. With the known TDI-CCD detectors, an increase in the line rate comes up against limits, since the accruing data quantities can no longer be read out and processed quickly enough.

Alternatively, CMOS detectors are known, which are increasingly replacing the analog CCD detectors. However, in particular with rapidly moving satellites, CMOS detectors are inferior to the TDI-CCD detectors, since the number of read-out electronics is limited and the charge transport is carried out intermittently. With such tasks, where the modulation transfer function (MTF) of the overall optical system is to be optimized, TDI-CCD sensors with continuous transport of the charge currents must therefore continue to be used.

A TDI line detector is known from German patent DE 10 2008 024 417 B3, containing n TDI lines, wherein each TDI line has m pixels, wherein a read-out register unit is assigned at least to one outer line, wherein its own register is assigned to each pixel of the first and/or n-th line, wherein the masking has a width of one pixel or an integer multiple of one pixel, wherein the registers of the pixels are expanded according to the width of the maskings. The load capacity of the registers can hereby be enlarged accordingly. On the other hand, the read-out speed of the individual line can be reduced. However, this is obtained at the expense of an information loss, which can be compensated for, however, by a detector arrangement with at least two TDI line detectors of this type. However, the prerequisite is that the satellite system in the position orientation must maintain the "Line of Side" requirement of better than ⅓ pixel over all lines operating in this type of interlace principle. This cannot currently be guaranteed for super-resolution satellites.

SUMMARY OF THE INVENTION

It is accordingly an object of the invention to provide a detector module which overcomes the above-mentioned disadvantages of the prior art devices of this general type, which is suitable for super-resolution satellites.

To this end, the detector module contains a multi-chip carrier. At least one TDI-CCD detector and at least one CMOS chip are arranged on the multi-chip carrier, which are electrically connected to one another. The CMOS chip contains at least the digital output electronics for the TDI CCD detector. Therefore the known advantages of the TDI-CCD detectors can continue to be used, which are produced in NMOS technology.

The digital output electronics with the analog signal processes or Analog-Digital-converters as well as the multiplexers is realized in CMOS technology, i.e., the technology of highly integrated rapid A/D converters in CMOS can be used, for which the read-out of the shift registers of the TDI-CCD detector presents no problems in terms of the clock rate. Thus line rates of 50-150 kHz with 30,000-40,000 pixels can be easily realized, which would correspond to a clock rate of 60 GHz. The necessary clock rate can be correspondingly reduced by division among several shift registers in the TDI-CCD part as well as several A/D converters in the CMOS part.

Preferably, the multi-chip carrier is composed of at least one ceramic, for example, aluminum nitride or aluminum oxide. These have the advantage that they have a similar thermal coefficient of expansion to silicon, so that no thermal stresses occur.

In another embodiment, the multi-chip carrier is composed of an aluminum nitride and an aluminum oxide ceramic, wherein the TDI-CCD detector is arranged on the aluminum nitride ceramic and the CMOS chip is arranged on the aluminum oxide ceramic. This produces a good thermal decoupling of the TDI-CCD part from the CMOS part, since aluminum nitride has a thermal conductivity that is greater by approximately a factor of 10 than aluminum oxide. Therefore heat is coupled less strongly into the nitride by the oxide due to the CMOS part.

In a further embodiment, the TDI-CCD detector and the CMOS chip are connected by flip chip technology and/or bonding wires, wherein bonding wires are preferably used because of the lower thermal coupling via the bonding wires, which further supports the thermal decoupling.

In a further embodiment, further standard ICs are arranged on the multi-chip carrier. For example, the line drivers for the TDI-CCD detector can be embodied as separate standard ICs. These are preferably also arranged on the aluminum oxide.

In a further embodiment, at least one capacitor for voltage supply and/or voltage stabilization is arranged on the multi-chip carrier, in particular in order to buffer the current peaks of the line drivers.

In a further embodiment, the detector module contains at least one mass memory, which is integrated in the CMOS chip or is arranged as a separate IC module on the multi-chip carrier.

In a further embodiment, the detector module contains at least one data compression unit, which is integrated in the CMOS chip or is arranged as a separate IC module on the multi-chip carrier.

In a further embodiment, a state machine for generating the control signals for the TDI-CCD detector and/or the CMOS chip is integrated into the CMOS chip.

Other features which are considered as characteristic for the invention are set forth in the appended claims.

Although the invention is illustrated and described herein as embodied in a detector module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages

DETAILED DESCRIPTION OF THE INVENTION

Figure 1:
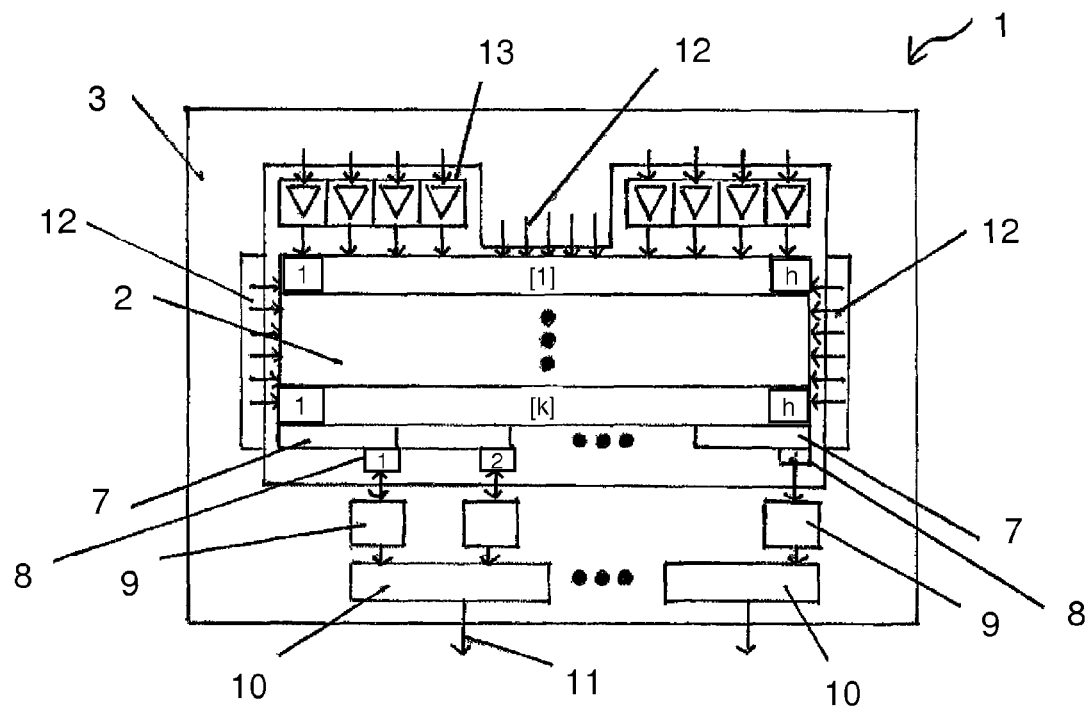
FIG. 1 is a schematic diagram of an arrangement of a detector module according to the invention.
Figure 2:
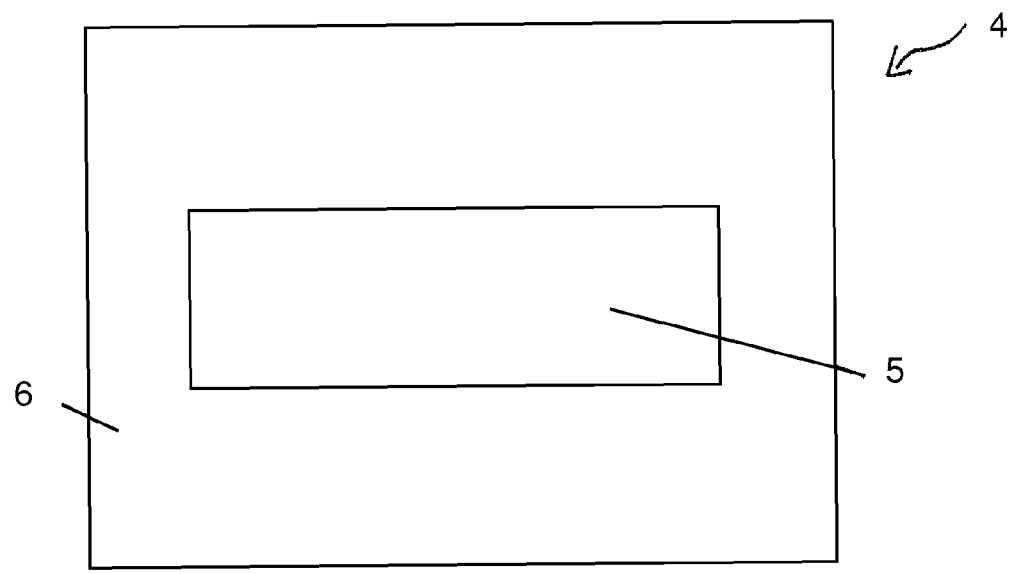
FIG. 2 is a diagrammatic representation of an unloaded multi-chip carrier.

Referring now to the figures of the drawing in detail and first, particularly, to FIG. 1 thereof, there is shown a detector module 1 that contains a TDI-CCD detector 2 constructed in NMOS technology and a CMOS-Chip 3, which are arranged on a common multi-chip carrier 4. The multi-chip carrier 4 is shown diagrammatically in FIG. 2 and contains an aluminum nitride ceramic 5 and an aluminum oxide ceramic 6. The aluminum oxide ceramic 6 thereby has a cutout, in which the aluminum nitride ceramic 5 is arranged. The two ceramics 5, 6 are, for example, adhered and/or screwed and/or soldered. The TDI-CCD detector 2 is thereby applied to the aluminum nitride ceramic 5 and the CMOS chip 3 is applied to the aluminum oxide ceramic 6.

The TDI-CCD detector 2 contains k-lines with respectively n pixels, wherein k lies, for example, between 100-1,000 and n lies, for example, between 30,000-40,000. At the output of the k-th line, registers in the form of i shift registers 7 are arranged for the n pixels, i.e., respectively n/i pixels of the k-th line write their data in parallel into a shift register 7, which can then be read out in a serial manner via an uncoupling diode 8 with an output amplifier.

The CMOS chip 3 contains i A/D converters 9, which are electrically connected respectively to an assigned uncoupling diode 8 with output amplifiers. Moreover, the CMOS chip 3 contains one or more multiplexers 10, which convert the data of the TDI-CCD detector 2 into a serial data stream 11. This data stream 11 can be stored in a non-illustrated mass memory or transmitted directly, for example, via a non-illustrated transmission device.

Preferably, the CMOS chip 3 further contains a state machine, which generates the control signals, in particular the clock signals for the TDI-CCD detector 2 and the components of the CMOS chip 3.

Furthermore, the CMOS chip 3 and the TDI-CCD detector 2 are connected to one another via common distributed ground connections 12.

Furthermore line drivers 13 for the TDI-CCD detector 2 are arranged on the multi-chip carrier 4, which are embodied as separate standard ICs. The line drivers 13 are thereby also arranged on the aluminum oxide ceramic 6. In principle, it is also possible to integrate the line drivers 13 into the CMOS chip 3. The line drivers 13 are connected on the one hand with the TDI-CCD detector 2, in order to drive the lines, and on the other hand are connected to the CMOS chip 3, from which they receive their select signals. Preferably, a ground connection also takes place via the CMOS chip 3.

Furthermore, a data compensation unit can be arranged on the CMOS chip 3, which compresses the serial data stream 11 before the transmission from the transmission unit or storage in the mass memory.

Furthermore, capacitors for voltage supply and/or voltage support for the TDI-CCD detector 2, the CMOS chip 3 and the line drivers 13 are preferably also arranged on the multi-chip carrier 4.

With the aid of this principle, lines of any desired length with k TDI steps can be selected and read out. This high integration density leads to an additional optimization with respect to the power dissipation.

The invention claimed is:

1. A detector module, comprising:
   a multi-chip carrier formed from an aluminum nitride ceramic and an aluminum oxide ceramic;
   at least one TDI-CCD detector produced via NMOS technology and disposed on said aluminum nitride ceramic of said multi-chip carrier; and
   at least one CMOS chip disposed on said aluminum oxide ceramic of said multi-chip carrier and electrically connected to said TDI-CCD detector, said CMOS chip having at least digital output electronics for said TDI-CCD detector.

2. The detector module according to claim 1, wherein said TDI-CCD detector and said CMOS chip are connected to one another by at least one of flip chip technology or bonding wires.

3. The detector module according to claim 1, further comprising further standard ICs disposed on said multi-chip carrier.

4. The detector module according to claim 3, further comprising line drivers for said TDI-CCD detector and embodied as separate standard ICs.

5. The detector module according to claim 1, further comprising at least one capacitor for voltage supply and voltage stabilization and disposed on said multi-chip carrier.

6. The detector module according to claim 1, further comprising at least one mass memory integrated in said CMOS chip.

7. The detector module according to claim 1, further comprising at least one data compression unit integrated in said CMOS chip.

8. The detector module according to claim 1, further comprising a state machine for generating control signals for at least one of said TDI-CCD detector or said CMOS chip and is integrated into said CMOS chip.

9. The detector module according to claim 1, further comprising at least one mass memory disposed as a separate IC module on said multi-chip carrier.

10. The detector module according to claim 1, further comprising at least one data compression unit disposed as a separate IC module on said multi-chip carrier.

11. The detector module according to claim 1, wherein the detector module is used in super-resolution satellites.

* * * * *